(12) United States Patent
Ridley et al.

(10) Patent No.: US 7,977,786 B2
(45) Date of Patent: Jul. 12, 2011

(54) SAW DEBRIS REDUCTION IN MEMS DEVICES

(75) Inventors: Jeff A. Ridley, Shorewood, MN (US); Max Glenn, Chanhassen, MN (US); James C. Nohava, Inver Grove Heights, MN (US); Robert D. Horning, Savage, MN (US); Jane Rekstad, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 440 days.

(21) Appl. No.: 12/180,320

(22) Filed: Jul. 25, 2008

(65) Prior Publication Data

US 2010/0019364 A1    Jan. 28, 2010

(51) Int. Cl.
*H01L 21/00* (2006.01)
*H01L 23/04* (2006.01)

(52) U.S. Cl. .................. 257/730; 257/E23.181; 438/51

(58) Field of Classification Search .................. 257/730, 257/E23.181; 438/51
See application file for complete search history.

(56) References Cited

U.S. PATENT DOCUMENTS

| | | | |
|---|---|---|---|
| 7,005,732 B2 * | 2/2006 | Horning et al. | 257/678 |
| 2004/0180464 A1 | 9/2004 | Horning et al. | |
| 2005/0084998 A1 | 4/2005 | Horning et al. | |
| 2008/0080832 A1 | 4/2008 | Chen et al. | |

OTHER PUBLICATIONS

European Patent Office, "European Search Report", May 17, 2010, Published in: EP.

* cited by examiner

*Primary Examiner* — Steven J Fulk
(74) *Attorney, Agent, or Firm* — Fogg & Powers LLC

(57) ABSTRACT

An improved MEMS device and method of making. Channels are formed in a first substrate around a plurality of MEMS device areas previously formed on the first substrate. Then, a plurality of seal rings are applied around the plurality of MEMS device areas and over at least a portion of the formed channels. A second substrate is attached to the first substrate, then the seal ring surrounded MEMS device areas are separated from each other. The channels include first and second cross-sectional areas. The first cross-sectional area is sized to keep saw debris particles from entering the MEMS device area.

16 Claims, 3 Drawing Sheets

SAW DEBRIS REDUCTION IN MEMS DEVICES

BACKGROUND OF THE INVENTION

Microelectromechanical system (MEMS) gyro devices are manufactured with many-die-in-wafer form, and need to be sawed into individual die. The MEMS devices are designed to be unsealed. This allows sawing fluid, and the debris in the fluid, to come in contact with active parts of the device. Since this device has moving parts, debris particles can interfere with or damage the operation of the device. Reducing or eliminating saw related debris will increase yield and reliability.

SUMMARY OF THE INVENTION

By changing the channel formation from a single step to a two step operation, and new masks for each step, a dam can be formed at one end of the channel with a gap that is controlled by etch time. This gap can be made to be small enough to restrict all but the smallest particles, but large enough to pass gas during the final packaging step. In addition, the gap can be lengthened to provide some compensation of the capacitive coupling from the metal line in the channel to the silicon ring above it. The extended area will decrease the capacitance of the metal/silicon, reducing or eliminating the increase from the dam area.

In an example method channels are formed in a first substrate around a plurality of MEMS device areas previously formed on the first substrate. Then, a plurality of seal rings are applied around the plurality of MEMS device areas and over at least a portion of the formed channels. A second substrate is attached to the first substrate, then the seal ring surrounded MEMS device areas are separated from each other. The channels include first and second cross-sectional areas. The first cross-sectional area is sized to keep saw debris particles from entering the MEMS device area.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
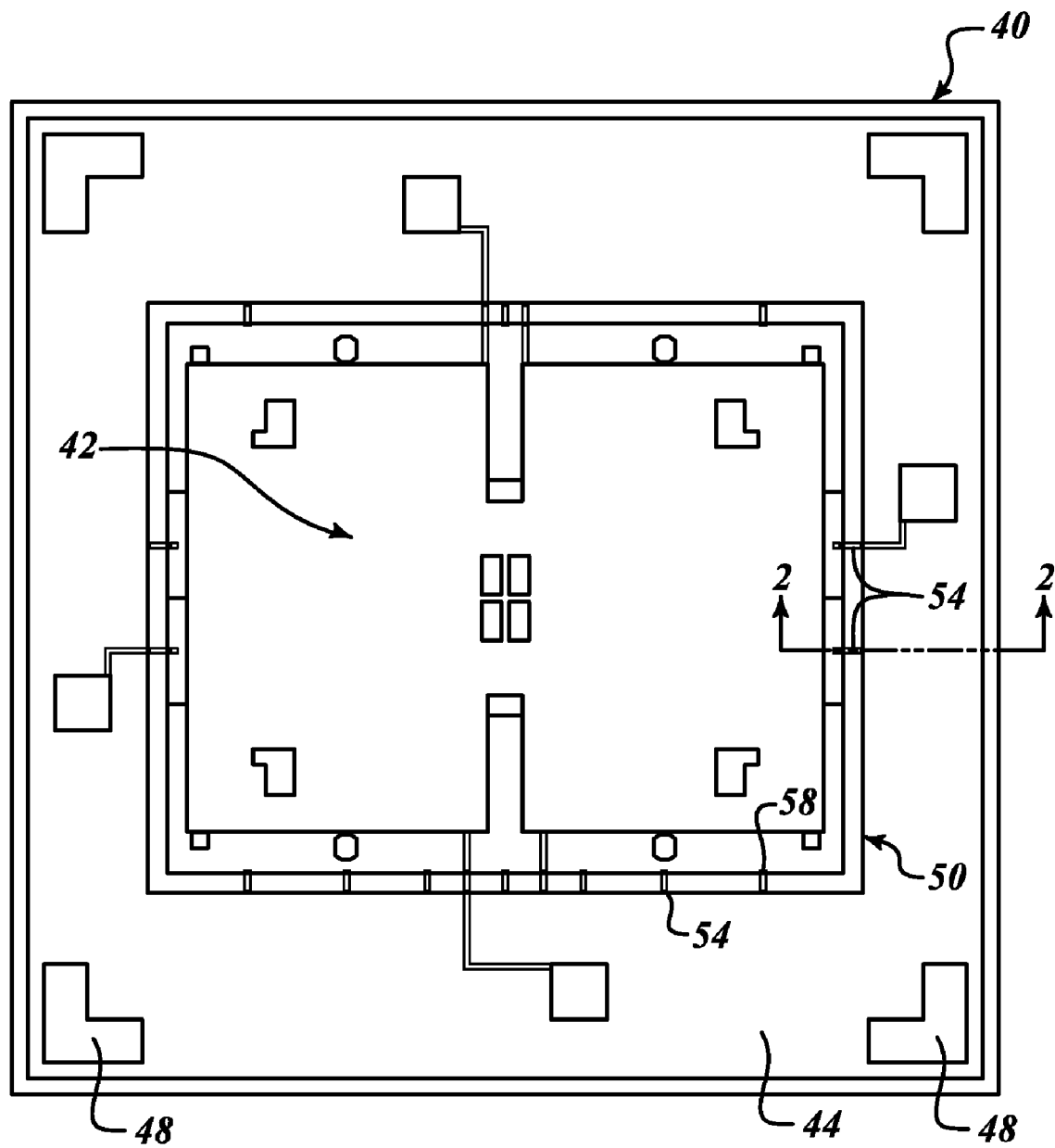
FIG. 1 illustrates a partial x-ray view of an example MEMS device package formed in accordance with an embodiment of the present invention.

FIG. 1 is a top view of a single microelectromechanical systems (MEMS) die formed on a lower wafer 40, such as that used in an upper sense plate MEMS device. The lower wafer 40, typically a 20-30 mils (500-750 µm) thick layer of glass, is bonded to a patterned silicon layer, typically 10-100 microns thick. This is then bonded to an upper wafer (not shown), typically a 15-25 mils (380-640 µm) thick layer of glass. The upper wafer, silicon layer, and lower wafer 40 are patterned and etched to expose active components such as accelerometer or gyroscope components. Channels 54, 58 are also patterned and etched into the lower wafer 40 from an interior side (device area) 42 to an exterior side 44 of a seal ring 50. The channels 54, 58 are sized to keep sawing fluid and debris from entering the device area 42 of the seal ring 50 when the wafers are separated into individual MEMS die packages.

The seal ring 50 and bonding anchors 48 are known materials for bonding the upper and lower wafers. After the upper and lower wafers and silicon are bonded, adjacent units are separated by cutting (sawing) around the unit at the outer border. This produces separate individual package components from many that are formed on the wafers. Saw debris can travel between the upper and lower wafers. The channels 54, 58 keep saw debris particles of a threshold size from entering the device area 42.

Electrical connections (leads) to active components in the device area 42 are applied to the channels 54 before the wafers are bonded. Other channels 58 are provided to allow for pressure to equalize between the device area 42 and space exterior to the wafers when inserted in a hermetically sealed package. The channels 54, 58 are capped with the seal ring 50 (e.g., ring of silicon etched from a silicon layer, other materials may be used for lower performance devices). The seal ring 50 surrounds the device area 42. The seal ring 50 bonds the wafers but does not block the channels 54, 58. The channels 54, 58 include a restriction that limits the flow of fluid and particles of a certain size from passing into the device area 42.

Figure 2:
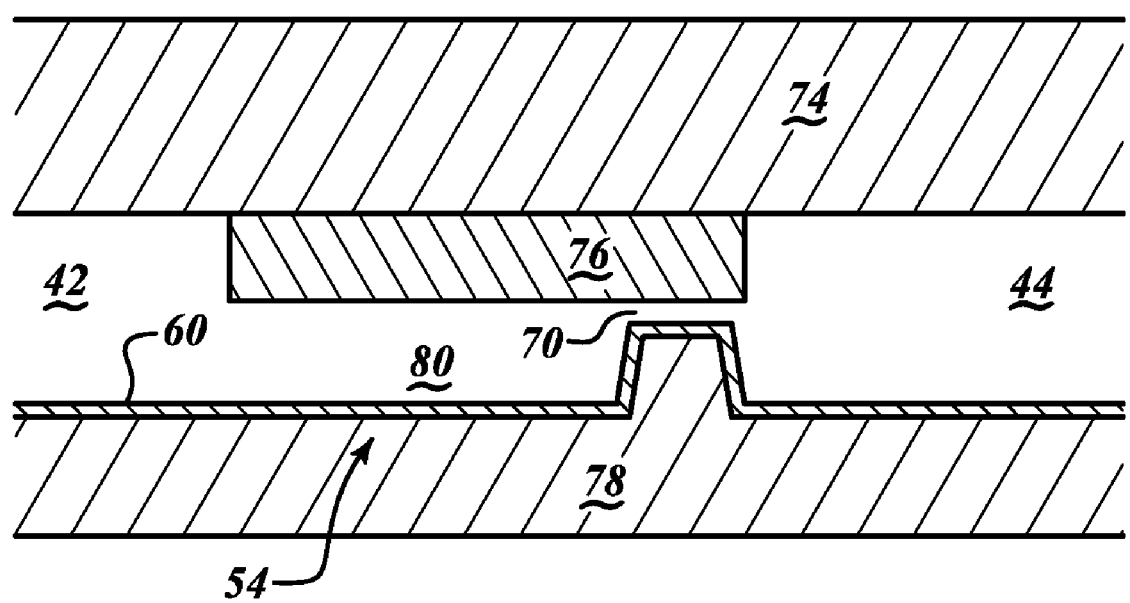
FIG. 2 illustrates a lengthwise cross-sectional view of a channel formed in accordance with an embodiment of the present invention.
Figure 3:
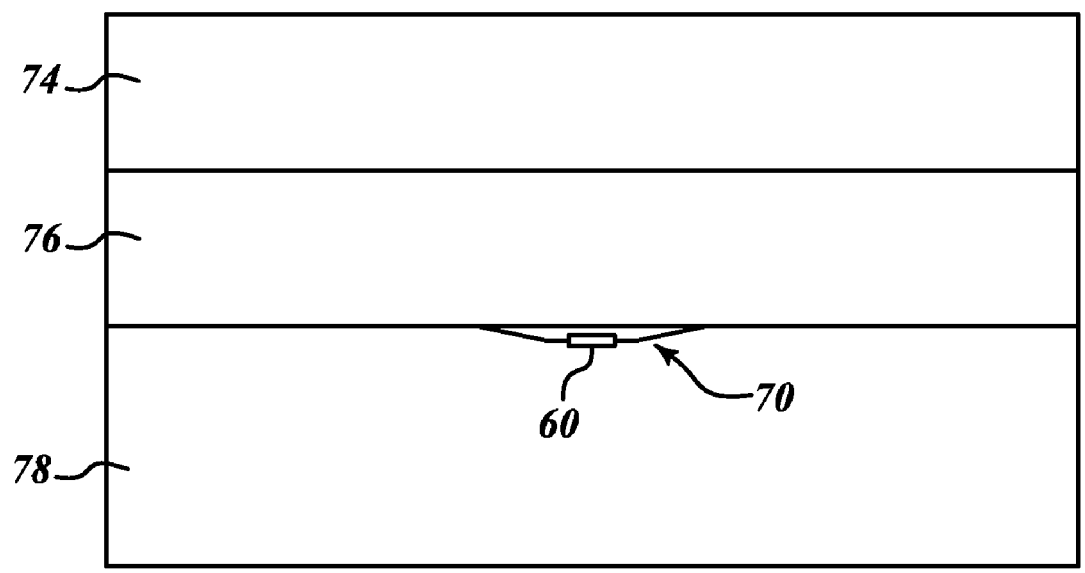
FIGS. 3 and 4 illustrate cross-sectional views of various sections of the section shown in FIG. 2.
Figure 4:
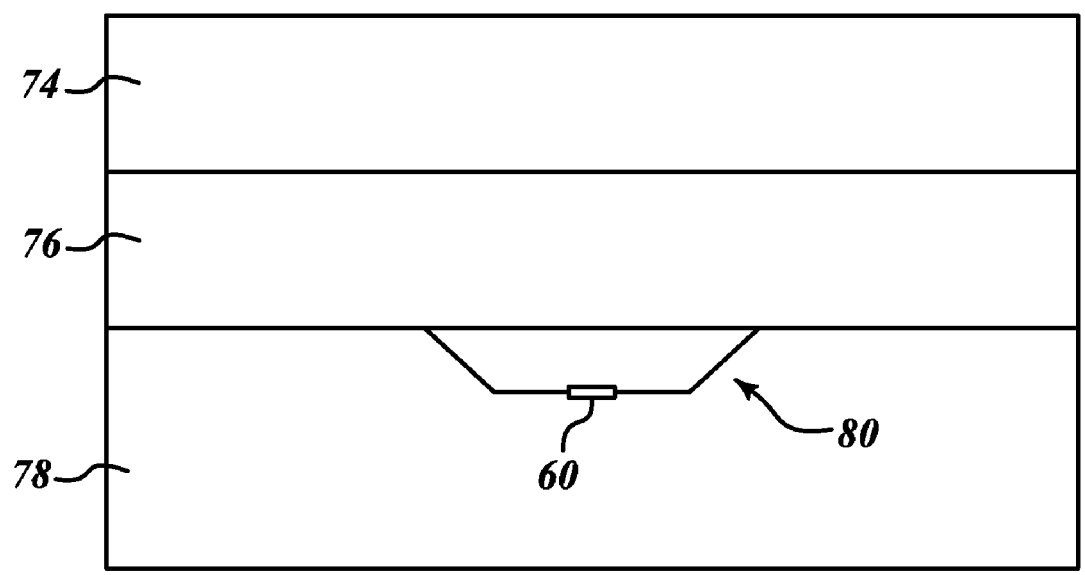

FIGS. 2-4 show various views of different parts of one of the electrical lead channels 54. FIG. 2 is a lengthwise cross-sectional view of a channel 54. The channel 54 is etched into a lower wafer 78. The channel 54 includes a non-dam section 80 and a dam section 70. The dam section 70 restricts the size of particles from passing into the device area 42. A seal ring 76 attaches an upper wafer 74 to the lower wafer 78.

FIG. 3 shows a cross-sectional view of the dam section 70 of the channel 54 on the lower wafer 78. In one embodiment, the dam section 70 is at an outboard end of the channel 54. The dam section 70 keeps certain sized particles out of the device area 42 and the rest of the channel 54.

FIG. 4 shows a cross-sectional view of a non-dam section 80 of the channel 54 as viewed from an inboard end looking outward from the device area 42. The areas 70, 82 are patterned (e.g. photolithography) and etched using known silicon/glass processing techniques. In one embodiment, the dam section 70 is between 0.5-1.0 µm in depth and the non-dam section 80 is between 3-5 µm in depth. Other dimensions may be used. In one embodiment, the deep part of the channel (the non-dam section 80) is etched first with the dam section 70 being masked off. Then the deep part is masked off and the shallow part (the dam section 70) is etched second. Other fabrication techniques may be used. An electrical lead 60 is then deposited into the channel 54 using known techniques. Other leads and electrical pads are also deposited throughout the lower wafer 78.

After the channels 54, 58 are formed, a seal ring 76 and any other bonding anchors are applied. The lower wafer 78 and the upper wafer 74 are bonded using the seal ring 76 and the bonding anchors. The final thickness of the seal ring 76 is approximately 10-100 µm. The depth of the non-dam section 80 and the length of the channels 54 are selected in order to minimize any capacitive coupling that may occur between a metal trace 60 and the seal ring 76

In one embodiment, the dam (the dam section 70) length is typically 5-50 µm long and the non-dam (the non-dam section 80) length is typically 50-100 µm long. The dam section 70 and the non-dam section 80 are both typically between 20-50 µm in width. Capacitive coupling depends on the length but not the width of the channels. It depends on the width of the metal lines 60 that go through these channels, and those are narrower than the channels.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method of making microelectromechanical (MEMS) devices, the method comprising:
    forming one or more channels in at least one of first and second substrates, at least one of the channels are formed around at least one MEMS device area formed on the first substrate;
    applying one or more seal rings over at least a portion of the formed channels; and
    attaching a second substrate to the seal ring,
    wherein the one or more channels comprises a first section having a first cross-sectional area and a second section having a second cross-sectional area;
    wherein the one of more channels each define a free space passage from the MEMS device area that is traversable to gasses;
    wherein a cross-sectional area of the free space passage is smaller at the first cross-sectional area than at the second cross-sectional area; and
    wherein at least one transition from the first section to the second section occurs in the portion of the formed channels covered by the one or more seal rings.

2. The method of claim 1, wherein the first cross-sectional area has a height value between 0.5-1.0 μm.

3. The method of claim 2, wherein the second cross-sectional area has a height value between 3-5 μm.

4. The method of claim 3, wherein the first cross-sectional area includes a length dimension having a range of 5-50 μm.

5. The method of claim 4, wherein the second cross-sectional area includes a length dimension having a range of 50-100 μm.

6. The method of claim 5, wherein the first and second cross-sectional areas include a width dimension having a range of 20-50 μm.

7. The method of claim 1, further comprising placing the attached substrates into a hermetically sealed package.

8. The method of claim 1, further comprising placing one or more electrical traces into a portion of the one or more channels prior to application of a corresponding seal ring.

9. The method of claim 1, wherein two or more of the MEMS device areas include a MEMS die, further comprising:
    sawing the attached first and second substrate to form at least one single MEMS die package.

10. A microelectromechanical (MEMS) device comprising:
    a first substrate attached to a second substrate using a seal ring in order to form a MEMS device area; and
    one or more channels formed in the first substrate, the one or more channels comprising a first section having a first cross sectional area and a second section having a second cross-sectional area, the one or more channels each providing a free space passage traversable to gasses from the MEMS device area to a space external to the seal ring;
    wherein a cross-sectional area of the free space passage is smaller at the second cross-sectional area than at the first cross-sectional area; and
    wherein at least one transition from the first section to the second section occurs in a portion of the formed channels covered by the one or more seal rings.

11. The device of claim 10, wherein the first cross-sectional area has a height value between 0.5-1.0 μm.

12. The device of claim 11, wherein the second cross-sectional area has a height value between 3-5 μm.

13. The device of claim 12, wherein the first cross-sectional area includes a length dimension having a range of 5-50 μm.

14. The device of claim 13, wherein the second cross-sectional area includes a length dimension having a range of 50-100 μm 15. The device of claim 14, wherein the first and second cross-sectional areas include a width dimension having a range of 20-50 μm.

16. The device of claim 10, further comprising one or more electrical traces deposited into a portion of the one or more channels prior to application of the seal ring.

* * * * *